United States Patent [19]

Goto et al.

[11] Patent Number: 5,185,295
[45] Date of Patent: Feb. 9, 1993

[54] METHOD FOR DICING SEMICONDUCTOR SUBSTRATES USING A LASER SCRIBING AND DUAL ETCH PROCESS

[75] Inventors: Haruyuki Goto, Yokosuka; Katsuhiko Kubota, Yokohama, both of Japan

[73] Assignee: Kabushiki Kaisha Toshiba, Kawasaki, Japan

[21] Appl. No.: 700,413

[22] Filed: May 15, 1991

[30] Foreign Application Priority Data

May 16, 1990 [JP] Japan ................................. 2-125710

[51] Int. Cl.⁵ ............................................. H01L 21/80
[52] U.S. Cl. ................................... 437/226; 156/651; 156/652; 437/173
[58] Field of Search ...................... 437/226, 227; 148/DIG. 28; 156/628, 651, 652, 653

[56] References Cited

U.S. PATENT DOCUMENTS

| | | | |
|---|---|---|---|
| 3,998,653 | 12/1976 | Anthony et al. | 156/656 |
| 4,224,101 | 9/1980 | Tijburg et al. | 156/643 |
| 4,343,662 | 8/1982 | Gay | 148/187 |
| 4,355,457 | 10/1982 | Barlett et al. | 437/226 |
| 4,383,886 | 5/1983 | Nakamura et al. | 156/659 |
| 4,978,421 | 12/1990 | Bassous et al. | 156/645 |

FOREIGN PATENT DOCUMENTS

| | | |
|---|---|---|
| 57-84135 | 5/1982 | Japan . |
| 62-218587 | 9/1987 | Japan . |
| 2-38587 | 2/1990 | Japan . |

*Primary Examiner*—Olik Chaudhuri
*Assistant Examiner*—Ken Horton
*Attorney, Agent, or Firm*—Finnegan, Henderson, Farabow, Garrett and Dunner

[57] ABSTRACT

The silicon substrate in which mesa semiconductor elements are formed is scribed along dicing lines by a laser. The resolidified silicon, which failed to vaporize during scribing, is etched away by sodium hydroxide solution. As a result, the silicon substrate is separated into a plurality of mesa semiconductor pellets. These pellets undergo chemical etching with a fluoric and nitric acid mixture to smooth the cut surfaces.

7 Claims, 2 Drawing Sheets

METHOD FOR DICING SEMICONDUCTOR SUBSTRATES USING A LASER SCRIBING AND DUAL ETCH PROCESS

BACKGROUND OF THE INVENTION

1. Field of the Invention

This invention relates to a method for dicing semiconductor substrates by which the wafer of substrate containing mesa semiconductor elements is separated into a plurality of pellets.

2. Description of the Related Art

Known methods for dividing a semiconductor substrate having mesa semiconductor elements into a plurality of pellets are chemical cutting and blade dicing techniques. The chemical cutting technique is to perform chemical dicing by etching as disclosed in U.S. Pat. No. 4,383,886. On the other hand, the blade dicing technique is to carry out mechanical dicing by means of blade dicers or the like. The latter method proceeds as follows: first, a semiconductor substrate is attached to a flat plate, such as a glass plate, using wax as adhesive; secondly, after the semiconductor substrate has been diced with a blade dicer, the wax is removed; and finally, damaged layers created during blade dicing are etched away by a mixed acid, such as a combination of hydrofluoric acid and nitric acid, to produce separated pellets.

However, such chemical cutting and blade dicing techniques have the following drawbacks. The chemical dicing technique takes a long time to finish dicing since etching is normally performed on one-side surface only. Moreover, the etching also develops in the lateral direction, so that to produce as large a pellet as that obtained by the blade dicing technique, it is necessary to increase the size of pellet by the amount of loss due to the lateral etching. In other words, the number of chips divided from a single wafer is declined. Contrarily, the blade dicing technique per forms dicing in a shorter time and with a smaller loss, but it is not best suited for the dicing of a semiconductor substrate in which mesa semiconductor elements are formed. This is because the uneven surfaces of a semiconductor substrate having mesa semiconductor elements makes it difficult to hold the substrate in place through vacuum absorption and necessitates attaching it to a glass plate or the like as mentioned above. It is troublesome to attach a semiconductor substrate having uneven surfaces to a flat plate without generating air bubbles. The existence of air bubbles may permit small size pellets to come off during dicing, resulting in a reduction in the yield.

As noted above, for substrates containing mesa semiconductor elements, conventional dicing methods cause a large pellet loss due to unwanted lateral etching and a reduced yield because of the difficulty in supporting a semiconductor substrate.

SUMMARY OF THE INVENTION

Accordingly, the object of the present invention is to provide a method for dicing semiconductor substrates that reduces a pellet loss due to etching in the lateral direction, and minimizes a reduction in the yield due to the difficulty of supporting substrates having mesa semiconductor elements to improve the productivity.

The foregoing object is accomplished by a method for dicing semiconductor substrates, comprising the steps of: scribing a silicon substrate containing mesa semiconductor elements by using a laser; separating the silicon substrate into a plurality of pellets by etching away, using alkali hydroxide solution, resolidified silicon that failed to vaporize during laser scribing; and smoothing the cut surfaces of the pellets by chemical etching with a mixed acid containing hydrofluoric acid and nitric acid.

When the silicon substrate is scribed by a laser to form deep grooves, part of the silicon melts, failing to vaporize, and resolidifies in the grooves as it cools. Etching the resulting substrate by a hydrofluoric and nitric acid mixture neither produces a good mesa form because of the remaining resolidified silicon, nor prevents the pellet loss from increasing because of the lateral etching, which leads to a failure to achieve the desired object. To overcome these shortcomings, after deep grooves are made in the silicon substrate using a laser, the substrate is treated with alkali hydroxide solution such as sodium hydroxide solution or potassium hydroxide solution to remove the resolidified silicon. At this time, the silicon substrate is also etched away by the alkali hydroxide solution, but the amount of silicon etched away from the substrate is extremely small compared with that of the resolidified silicon. As a result, practically only the resolidified silicon is selectively removed. After this, a light etching by a hydrofluoric and nitric acid mixture eliminates damage layers caused during scribing, thereby producing a plurality of complete mesa semiconductor pellets.

In the manufacturing method described above, the semiconductor substrate (the silicon substrate) is mostly cut by a laser, which reduces the loss due to unwanted lateral etching found in the chemical cutting technique. Laser scribing, which is non-contact cutting, allows the substrate to be held in place without perfect vacuum absorption. This suppresses the reduction of the yield owing to the difficulty in supporting the semiconductor substrate having mesa semiconductor elements, a problem encountered in the blade dicing technique. All these improvements combine to provide a method for dicing semiconductor substrates that betters the productivity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates a presently preferred embodiment of the invention and, together with the general description give above and the detailed description of the preferred embodiment given below, serves to explain the principles of the invention.

DETAILED DESCRIPTION OF THE PREFERRED EMBODIMENTS

Referring to the accompanying drawings, an embodiment of the present invention will be explained hereinafter.

Figure 1:
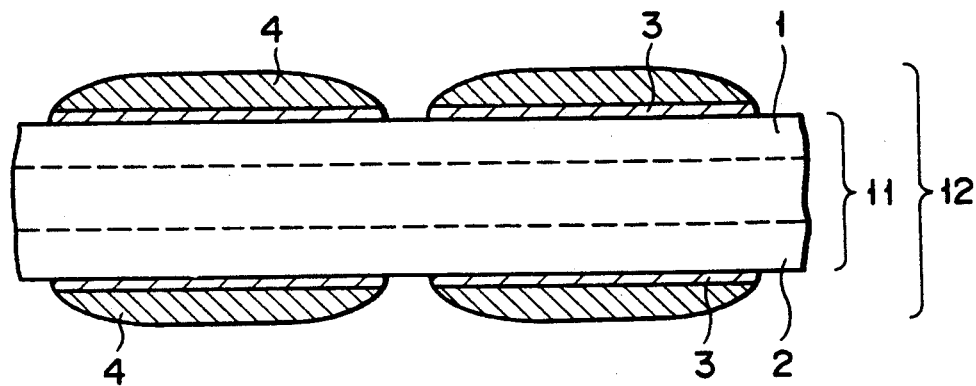
FIGS. 1 through 4 are sectional views illustrating a method for dicing semiconductor substrates according to an embodiment of the present invention.
Figure 2:
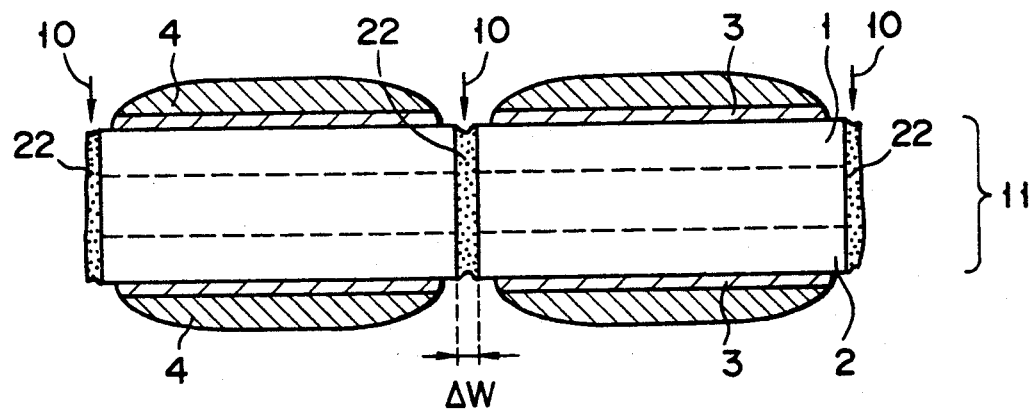

FIGS. 1 through 4 sequentially show the processes for separating a semiconductor substrate containing mesa rectifying elements into pellets. FIG. 1 is a sectional view of a semiconductor substrate before the separation into pellets. An n+-type impurity diffused layer 1 is formed at one-side surface region of an n-type silicon substrate 11 of the order of 240 μm in thickness, while a p+-type impurity diffused region is formed at the other-side surface region. Formed on both surfaces of the substrate 11 are nickel plating layers 3, which undergo patterning by the PEP technique. In this process, the plating layers 3 are removed so as to leave regions for electrodes, on which solder layers 4 are to be formed. On the electrodes, the solder layers 4 are formed through solder dipping.

On the semiconductor substrate (the soldered semiconductor substrate 12) containing mesa rectifying elements with the above-mentioned structure, a YAG (Yttrium Aluminum Garnet) laser beam with an output of 21 W is thrown to penetrate and cut the n-type silicon substrate 11, the irradiating position being indicated by the arrow 10. In this embodiment, the moving speed of laser beam was 50 mm/sec and the cutting width ΔW was 50 μm.

Figure 3:
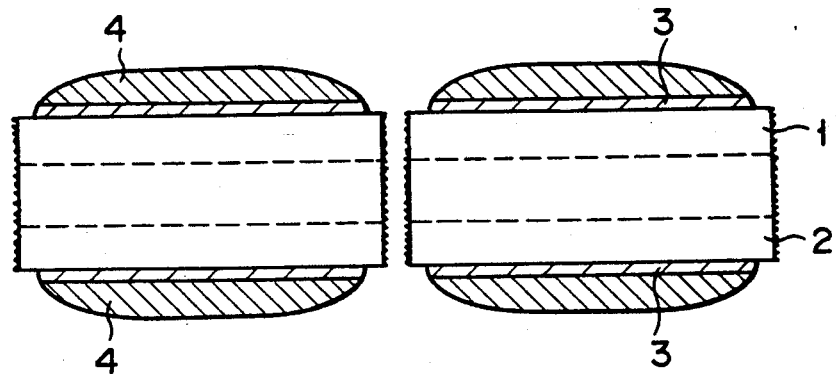
Figure 4:
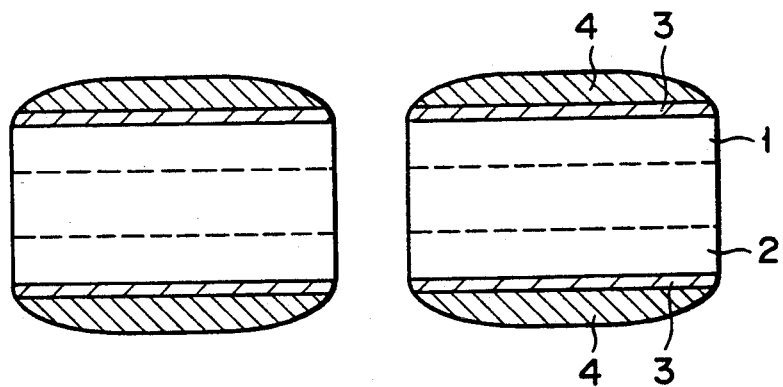

The boiling the substrate 11 in a 5% sodium hydroxide solution for 5 to 10 minutes melts the resolidified silicon layers 22 (the silicon left behind in the grooves as a result of the resolidifying of silicon that failed to vaporize during laser scribing or groove cutting), so that the substrate is separated into individual semiconductor pellets as shown in FIG. 3. In this case, the silicon substrate 11 is also etched by the same sodium hydroxide solution, but the etching amount of the substrate silicon is extremely small compared with that of the resolidified layer 22: it is etched away to a thickness of as small as nearly 5 to 15 μm.

After this, semiconductor pellets thus obtained are etched in a mixed acid of hydrofluoric acid and nitric acid (whose volume ratio is 3 : 2, for example) for several seconds to remove damaged layers resulted from scribing.

Use of the above-described technique reduces the loss due to the lateral etching of the silicon substrate 11, improving the usability of material. Table 1 lists figures comparing a technique according to the present invention with the chemical cutting technique. In this table, a yield of pellets produced from a wafer of 100 mm in diameter is indicated by chip size and the effect of this invention is represented in a yield ratio of B/A where B is the laser scribing technique according to the present invention and A is the chemical cutting technique.

TABLE 1

| CHIP SIZE | 1 mm × 1 mm | 2 mm × 2 mm | 3 mm × 3 mm |
|---|---|---|---|
| CHEMICAL CUTTING (A) | 3828 pcs | 1271 pcs | 619 pcs |
| LASER SCRIBING (B) | 6687 pcs | 1740 pcs | 780 pcs |
| B/A | 1.75 | 1.37 | 1.26 |

The laser scribing technique is based on non-contact cutting, which allows the substrate to be held in place without perfect vacuum absorption. This makes it unnecessary to attach the substrate to a flat plate, avoiding problems associated with the blade dicing technique that requires the attachment of the substrate to a flat plate.

Moreover, leakage current of the mesa rectifying element can be minimized by two chemical etching processes: one using sodium hydroxide solution and the other using a mixed acid of hydrofluoric acid and nitric acid. A single etching process cannot sufficiently remove the crystalline deformations of the substrate caused near the cut surfaces during laser scribing. Those deformations plus the uneven cut surfaces can cause leakage currents.

The present invention is not restricted to the above-mentioned embodiment but may be practiced or embodied in still other ways without departing from the spirit or essential character thereof. For example, while in the above embodiment, the present invention is applied to the manufacturing processes for mesa rectifying elements, it may be applicable to the manufacturing processes for other mesa semiconductor devices formed in the substrate, such as mesa control rectifying elements or mesa transistors. Although in the forgoing embodiment, sodium hydroxide solution is used to melt the silicon resolidified layer 22, other alkali hydroxide solutions such as potassium hydroxide solution may be used. While in the above-noted embodiment, a laser beam is thrown on the substrate on the side of the n+-type impurity diffused layer 1, it may be irradiated on the p+-type impurity diffused layer 2, reversing the substrate 12, which will give a similar cutting finish.

In the foregoing embodiment, the laser beam is allowed to completely penetrate the substrate for cutting, but it may be made to penetrate to a cutting depth of 150 to 200 μm, leaving some distance behind. In this case, the gentler bevel angle is obtained, which is helpful for producing elements of high withstand voltage. However, it requires a longer time for etching by a mixed acid, resulting in a small increase in the etching loss.

While in the aforementioned embodiment, the nickel plating layer 3 and solder layer 4 are selectively formed, solder layers may be formed over the entire surfaces of both sides of the substrate 11, which is cut by allowing the laser beam to penetrate the substrate from one solder layer to the other. In this connection, the present invention is applicable to the cutting of a high-pressure stacked diode, a plurality of semiconductor substrates stacked one on top of another, sandwiching a solder layer between them.

With this invention, it is possible to freely control the mesa angle by suitably changing the laser scribing conditions such as changing the laser focusing position or irradiating the laser beam more than once during scribing.

As described above, the present invention provides a method for dicing semiconductor substrates that not only reduces the loss due to etching in the lateral direction, but also suppresses the decrease of the yield owing to the difficulty in supporting the semiconductor substrate, there by improving the productivity.

What is claimed is:

1. A method for dicing semiconductor substrates, comprising the steps of:
   scribing a silicon substrate containing mesa semiconductor elements by using a laser;
   separating said silicon substrate into a plurality of pellets by etching away, using alkali hydroxide solution, resolidified silicon that failed to vaporize during laser scribing; and
   smoothing the cut surfaces of said pellets by chemical etching with a mixed acid containing hydrofluoric acid and nitric acid.

2. A method according to claim 1, wherein said silicon substrate has p-n junction portions formed therein and said substrate is cut at those p-n junction portions.

3. A method according to claim 1, wherein said alkali hydroxide solution is sodium hydroxide solution.

4. A method according to claim 3, wherein said sodium hydroxide solution is in a concentration of 5% and is boiled for 5 to 10 minutes for etching.

5. A method according to claim 1, wherein said alkali hydroxide solution is potassium hydroxide solution.

6. A method according to claim 1, wherein said step of smoothing the cut surfaces of said pellets by chemical etching with a mixed acid containing hydrofluoric acid and nitric acid is carried out for several seconds.

7. A method according to claim 1, wherein said mixed acid containing hydrofluoric acid and nitric acid has a volume ratio of hydrofluoric acid to nitric acid 3 : 2.

* * * * *